United States Patent [19]

Tsai

[11] Patent Number: 6,060,953
[45] Date of Patent: May 9, 2000

[54] PLL RESPONSE TIME ACCELERATING SYSTEM USING A FREQUENCY DETECTOR COUNTER

[75] Inventor: Chao-Ming Tsai, Sunnyvale, Calif.

[73] Assignee: Winbond Electronics Corporation, Hsinchu, Taiwan

[21] Appl. No.: 09/057,232

[22] Filed: Apr. 8, 1998

[51] Int. Cl.[7] .............................. H03L 7/087; H03L 7/089
[52] U.S. Cl. ........................... 331/11; 331/1 A; 331/1 Y; 331/17; 331/25; 331/27
[58] Field of Search ................................. 331/11, 14, 25, 331/27, 17, 1 A

[56] References Cited

U.S. PATENT DOCUMENTS

| | | |
|---|---|---|
| 4,069,462 | 1/1978 | Dunn ........................................... 331/11 |
| 4,547,747 | 10/1985 | Wolaver et al. ............................ 331/17 |
| 4,987,355 | 1/1991 | Leaper et al. ............................... 327/58 |
| 5,446,416 | 8/1995 | Lin et al. .................................... 331/11 |

*Primary Examiner*—Siegfried H. Grimm
*Attorney, Agent, or Firm*—Proskauer Rose LLP

[57] ABSTRACT

A PLL response time is accelerated with a frequency detector counter. The PLL utilizes both a phase frequency detector and the frequency detector counter. Initially, the operation of the PLL is controlled by the frequency detector counter and the output of phase frequency detector does not affect the PLL system. During this period, the PLL synchronizes to an input clock frequency. After the PLL reaches a predetermined frequency range, the frequency detector counter stops working. Thereafter, the phase frequency detector controls the operation of the PLL. During this period, the PLL synchronizes to both the frequency and the phase of the input signal.

12 Claims, 7 Drawing Sheets

PLL RESPONSE TIME ACCELERATING SYSTEM USING A FREQUENCY DETECTOR COUNTER

FIELD OF THE INVENTION

The present invention generally relates to a phase lock loop and more specifically relates to a phase lock loop system wherein the response time for synchronizing to a reference clock is initially accelerated by a frequency detector counter that is disabled after reaching a predetermined output frequency.

BACKGROUND OF THE INVENTION

In the prior art, a traditional Phase Locked Loop (PLL) may produce a clock or several clocks synchronized to a reference clock. In many systems, a PLL is integrated onto an integrated circuit chip that also contains the system circuitry, such as a super IO chip for a floppy disk controller. In other applications, such as in data transmission, oftentimes receiving and decoding clocks are synchronized to a transmitting or system clock (e.g., an MPEG decoder chip). In any case, the greater the time required for synchronization, the less throughput produced by a given system.

FIG. 1 shows a traditional PLL 100 having a Phase-Frequency Detector (PFD) 120. The PLL 100 is a closed loop system wherein an clock output 150 is fed back to the PLL 100 and in turn results in a change in the clock output 150. In operation, the PFD 120 produces an output signal 180 in response to a reference clock 110 and a correcting signal 170 from a frequency divider (÷N) 160. The output signal 180 is related to the phase error between the reference clock 110 and the correcting signal 170 and contains a difference frequency and a DC offset $V_i$. The difference frequency is removed by a filter 130 and the DC offset $V_i$ is provided to a Voltage Controlled Oscillator (VCO) 140.

The DC offset $V_i$ causes the VCO 140 to produce the clock output 150. The frequency divider 160 receives the clock output and produces the correcting signal 170. The larger the difference between the reference clock 110 frequency and the clock output 150 frequency, the larger the correcting signal 170. The DC offset $V_i$ varies the frequency of the clock output 150 in the direction of the reference clock 110. When the clock output 150 frequency equals the frequency of the reference clock, the difference frequency becomes zero Hz and the VCO 140 locks to the reference clock 110. The response time for the VCO 140 to lock to the reference clock 110 may be adjusted by altering system parameters such as changing the N value of the frequency divider 160.

FIGS. 2A and 2B illustrate the effects of varying the response time for the PLL 100 to synchronize to a reference clock. FIG. 2A shows a case wherein the system parameters are selected to result in a slow rise time for the DC OFFSET $V_i$. As shown, for a slow rise time $t_1$ for the DC offset $V_i$, there is a small damping prior to the DC offset voltage $V_i$ reaching a steady state.

FIG. 2B shows a case wherein the system parameters are selected to result in a fast rise time for the DC OFFSET $V_i$. As shown, for a fast rise time $t_2$ for the DC offset $V_i$, there is a large damping prior to the DC offset voltage $V_i$ reaching a steady state. Consequently, in the prior art, a PLL having a PFD may synchronize the clock output to the reference clock either quickly with a larger damping, or slowly with less damping. The goal of a PLL system is to quickly synchronize to the reference clock with less damping. The quicker the PLL system becomes stable, the sooner the output clock may be used by a system. In addition, during the design of a PLL system, the longer the output clock takes to reach a steady state (e.g., oscillates), the more time required for simulating and developing the PLL system.

Logically therefore, the PLL that has a fast rise time and requires a larger damping is desirable. Yet, the large overshoot of the DC offset voltage $V_i$ may damage portions of the PLL 100 and may result in latch-up. The PLL 100 may be designed to handle the large voltage surges but as a consequence would utilize more chip surface area. This results in less chip surface area available for other circuit integration. In addition, a PLL having a fast rise with large damping consumes more peak power than a PLL having a slow rise time.

Other systems are known that can accelerate the time of the PLL to reach steady state with less damping. In one such system, a frequency detection counter (FDC) is incorporated in to the closed loop of the PLL. The FDC detects a frequency difference between the reference clock and a correcting signal. In addition, the FDC has a relatively fast response time for synchronizing to the frequency of the reference clock. However, when the PFD and the FDC are combined in a single closed loop system, the PFD and FDC tend to interfere with each other. Consequently, this system may become unstable or may have difficulty reaching a steady state.

In another prior art system, U.S. Pat. No. 5,446,416 entitled "Time Acquisition System with Dual-Loop for Independent Frequency Phase Lock", utilizes a dual loop system comprised of a frequency lock loop (FLL) and an independent PLL. The FLL employs an FDC while the PLL employs a PFD.

In operation, when an output frequency of an output clock is outside a range of target output frequencies, the FLL operates to synchronize the frequency of the output clock to the reference clock. At this time, the PLL is not operating. When the output frequency is within the range of target output frequencies, the FLL stops operating and the PLL begins operating to correct the phase of the output clock. The problem with this system is that for a case where the reference clock signal drifts (e.g., changes frequency or phase) beyond the range of target output frequencies, the PLL will stop operating and the FLL will again begin operating. In a case wherein the reference clock continues to drift, both the PLL system and the FLL system will alternate between operating and not operating. Consequently, the alternating between the FLL and the PLL results in an unstable system.

To solve the above problems, a novel PLL accelerating system is hereby disclosed.

Consequently, it is an object of the present invention to provide a PLL that has both a fast response time to reach a steady state and has small damping.

Another object of the present invention is to provide a method for a frequency detection counter (FDC) to cooperate with a phase frequency detector (PFD) without resulting in an unstable system.

A further object of the present invention is to provide a self-stop FDC which can be used in a PLL system.

A still further object of the present invention is to provide an integrated circuit that requires relatively less chip surface area yet produces a quick stable PLL for frequency generation.

SUMMARY OF THE INVENTION

These and other objects of the present invention are achieved by a phase locked loop (PLL) accelerating system in accordance with the present invention. The present invention includes a PLL system that synchronizes a clock output to a reference clock. In accordance with the present invention, the PLL system utilizes a frequency detection counter (FDC) in a frequency detector which only operates at the very beginning of the synchronization period. Initially, the FDC jumps the PLL system to within a desired frequency range. After the desired frequency range is reached, the FDC stops operating. Thereafter, the PFD takes the place of the FDC and tunes the phase and frequency of the clock output until the clock output and the reference clock are synchronized.

In a case where the reference clock drifts after the FDC has stopped operating, the PFD continues to operate to resynchronize the clock output with the reference clock. Regardless of the degree of drift, the FDC does not begin operation again after it has stopped operating. Consequently, in no case does the FDC and the PFD interfere with each other to produce an unstable system. Yet, by using the FDC initially during synchronization, the PLL system achieves a steady state quickly without a large damping. In addition, since the present invention does not have a large damping, the circuit may utilize less integrated circuit surface area, consumes less power, and has less problems with latch-up then prior art approaches. Consequently, the present invention may be readily integrated on a chip with other integrated circuits, such as floppy disk controller circuits.

BRIEF DESCRIPTION OF THE DRAWINGS

The following is a description of an embodiment of the present invention that when taken together with the following drawings will demonstrate the above noted features and advantages, as well as further ones. It should be expressly understood that the drawings are included for a illustrative purposes and do not represent the scope of the present invention. The invention is best understood in conjunction with the accompanying drawings in which.

DETAILED DESCRIPTION OF THE INVENTION

Figure 1:
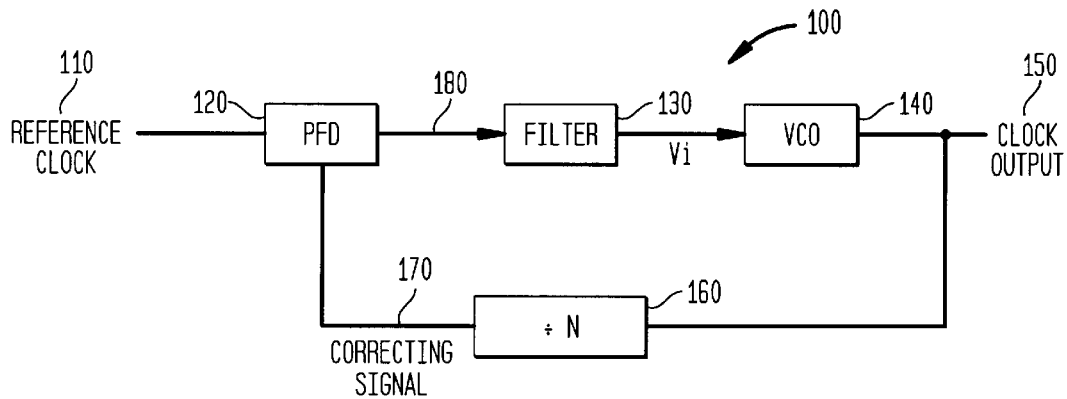
FIG. 1 is a circuit diagram of a prior art PLL utilizing a PFD.
Figure 2A:
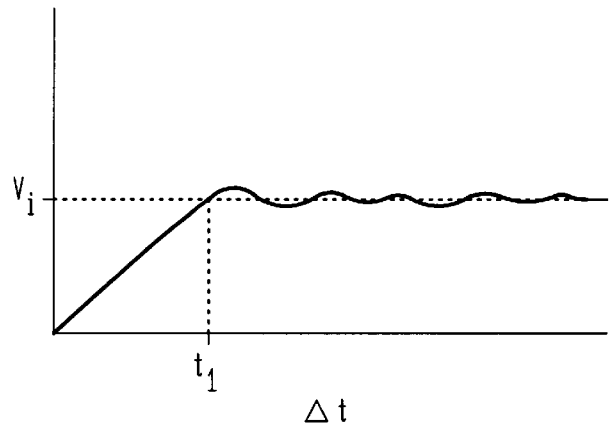
FIGS. 2A and 2B are wave diagrams of the DC offset voltage $V_i$ in a prior art PLL illustrating the effects of altering the rise time to achieve a steady state condition.
Figure 2B:
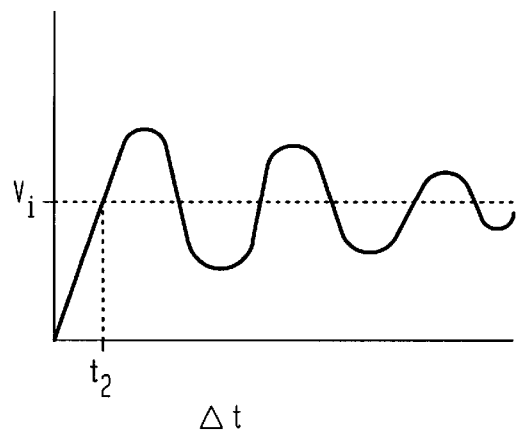
Figure 3:
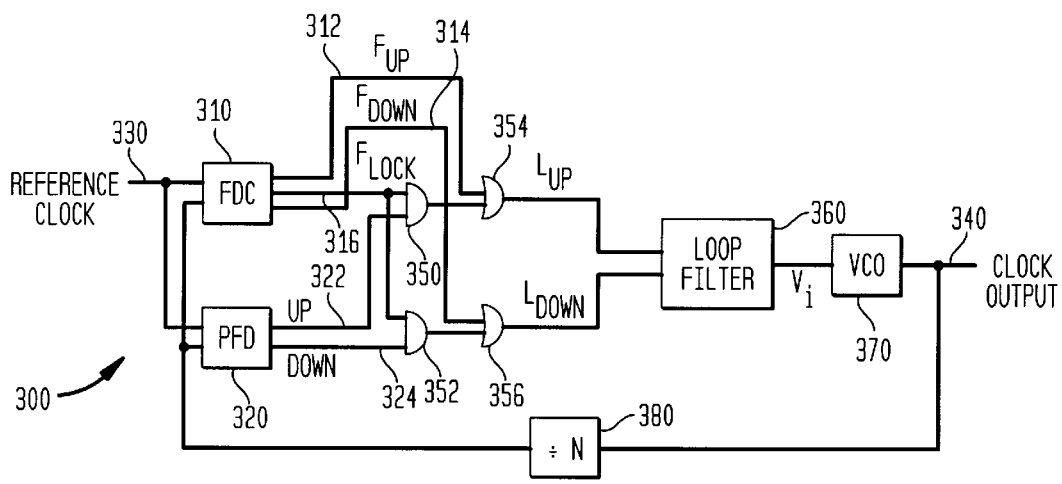
FIG. 3 is a circuit diagram of the present inventive PLL system.

FIG. 3 shows an embodiment of a present inventive PLL system 300. In accordance with the present invention, the PLL system includes a frequency detection counter (FDC) 310 and a phase frequency detector (PFD) 320. The FDC 310 has three output signals including an $F_{UP}$ signal 312, an $F_{DOWN}$ signal 314, and an $F_{LOCK}$ signal 316. The PFD 320 illustratively produces two output signals, an UP signal 322 and a DOWN signal 324. The PLL system also utilizes a loop filter 360, a voltage controlled oscillator (VCO) 370, and a frequency divider (÷N) 380.

Figure 8A:
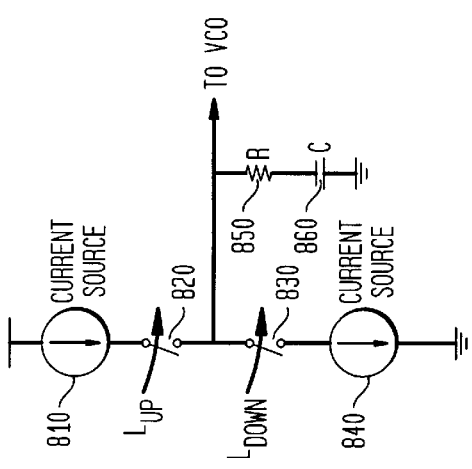
FIGS. 8A and 8B are respectively a block schematic diagram and a detailed schematic diagram of a loop filter in accordance with an embodiment of the present invention.
Figure 8B:
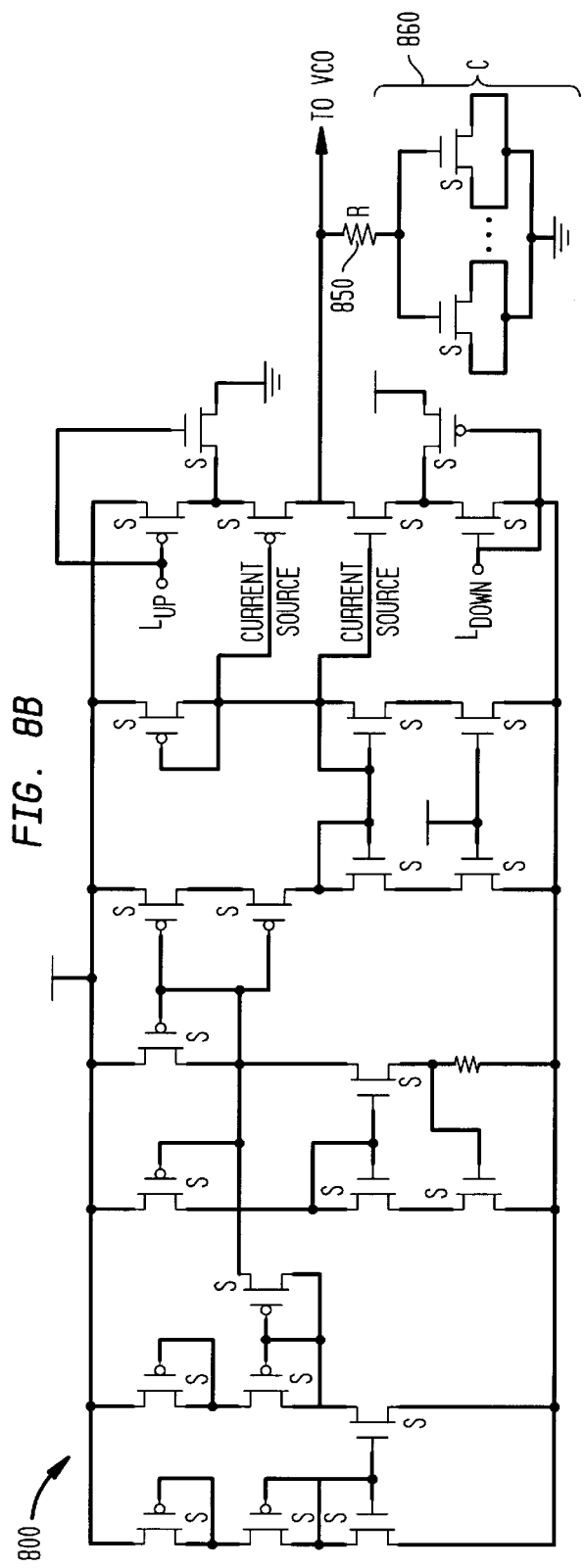

FIGS. 8A and 8B show respectively a block schematic diagram and a detailed schematic diagram of a loop filter 800 in accordance with an embodiment of the present invention. The loop filter is shown having a charging current source 810, a charging switch ($L_{UP}$) 820, a discharging current source 840, a discharging switch $L_{DOWN}$ 830, a resistive circuit (resistor 850), and a capacitance circuit (capacitor 860). As shown, the capacitor 860 may be comprised of multiple, parallel connected FET transistors with sources and drains connected together.

In operation, in response to an $L_{UP}$ signal, the charging switch 820 closes and capacitor 860 charges through resistor 850, thereby increasing the voltage to the VCO. In response to an $L_{DOWN}$ signal, discharging switch 830 closes and capacitor 860 discharges through resistor 850 thereby decreasing the voltage to the VCO. It should be noted that due to the operation of the FDC (discussed in more detail below), the $L_{UP}$ signal and the $L_{DOWN}$ signal are not present at the same time.

Returning to FIG. 3, the VCO 370 receives an output signal (e.g., voltage) from the loop filter 360 and produces a clock output signal 340. The frequency divider 380 receives the clock output signal 340 from the VCO 370 and produces a correcting signal (CLKIN) that is received by the FDC 310 and the PFD 320.

Initially, the PLL system 300 does not use the PFD 320 as an element of the closed loop system. Illustratively, the FLOCK signal 316 removes the PFD 320 from the PLL system 300 operation through the use of AND gates 350, 352, OR gates 354, 356 and the FLOCK signal 316. The FLOCK signal operates as an enable signal for the PFD 320 output signals. Specifically, the FLOCK signal is received by AND gates 350 and 352 which also receive UP and DOWN respectively. Outputs from AND gates 350, 352 respectively are received by OR gates 354, 356 which also receive $F_{UP}$ and $F_{DOWN}$, respectively.

In the embodiment shown, the FLOCK signal 316 is low during the period prior to the CLKIN signal reaching a predetermined frequency range (discussed in more detail below). In this period, the PLL system 300 operates as a frequency following system. In operation, the FDC 310 continues to operate until reaching the predetermined frequency range. At this time, the FDC 310 stops operating and thereafter, regardless of the frequency of the clock output 340, the FDC 310 does not again start operating.

Figure 4:
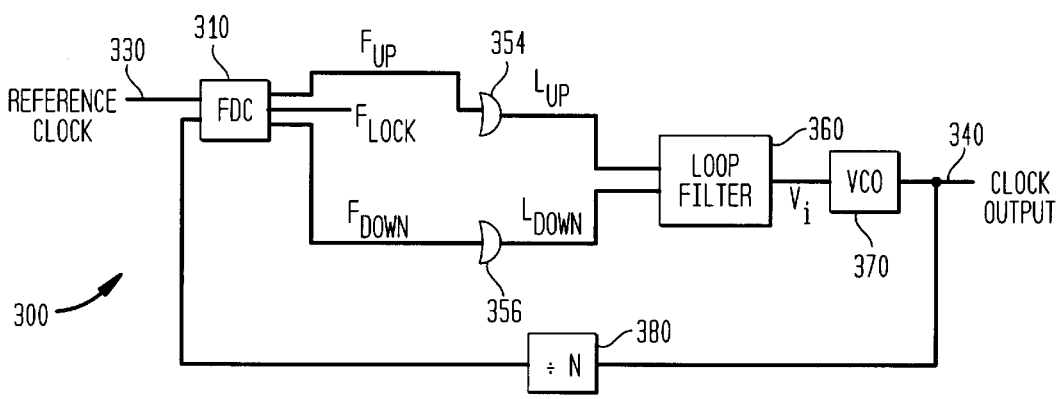
FIG. 4 is a functional circuit diagram of the present invention during a time period prior to the clock output reaching the predetermined frequency range.

FIG. 4 shows a functional circuit diagram of the present invention during the period prior to reaching the predetermined frequency range. In this period, the outputs of the frequency detection counter control the PLL system 300. In operation, the input of the loop filter, $L_{UP}$ and $L_{DOWN}$, is effectively connected to the $F_{UP}$ signal 312 and the $F_{DOWN}$ signal 314, respectively. In the embodiment shown, after the predetermined frequency range is reached, the $F_{LOCK}$ signal goes high. Three clock cycles later, the frequency detection counter stops working automatically and the $F_{UP}$ signal 312 and the $F_{DOWN}$ signal 314 go low and remain low thereafter.

Figure 5A:
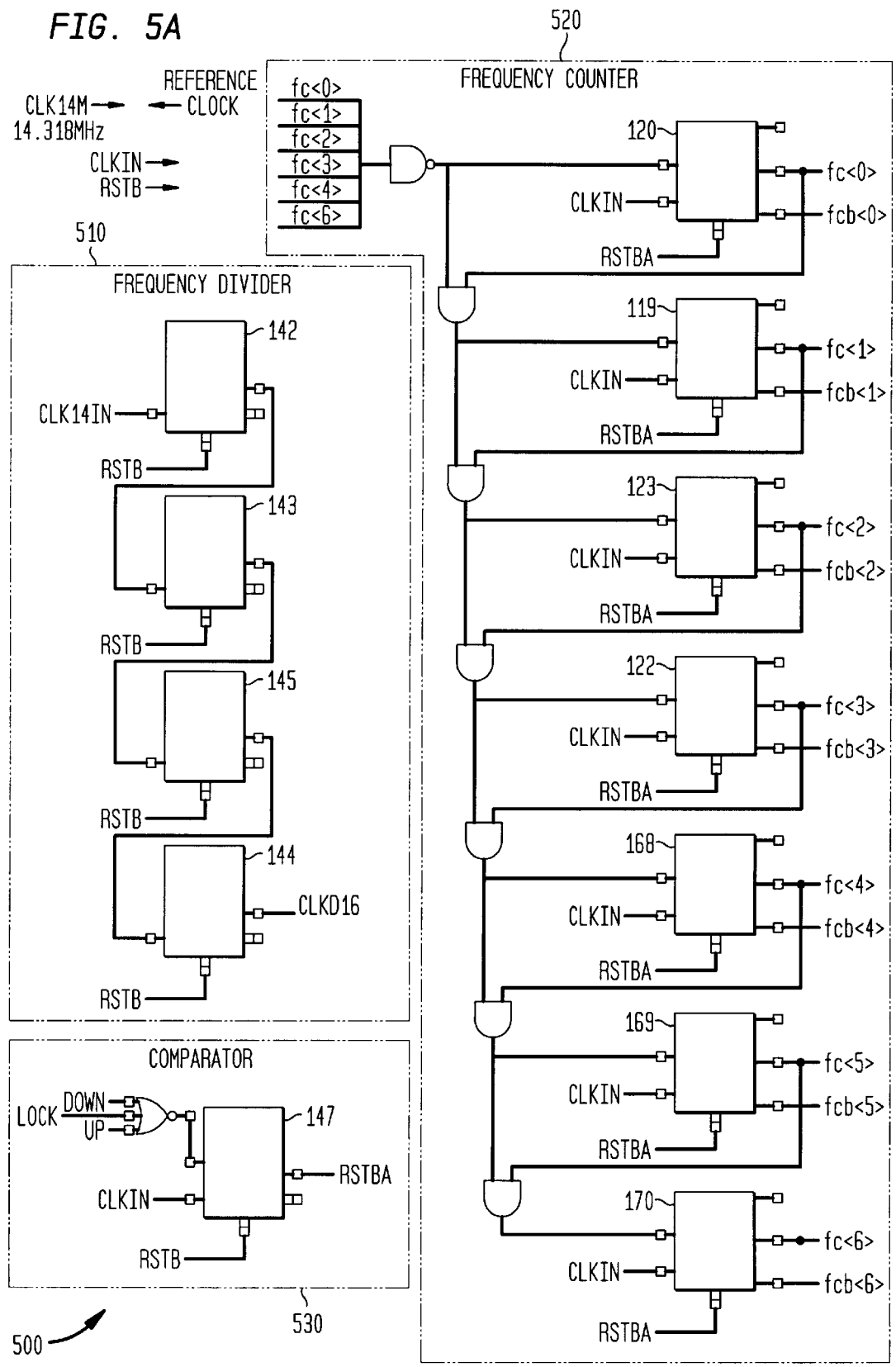
FIG. 5 is a schematic diagram of a FDC in accordance with an embodiment of the present invention.
Figure 5B:
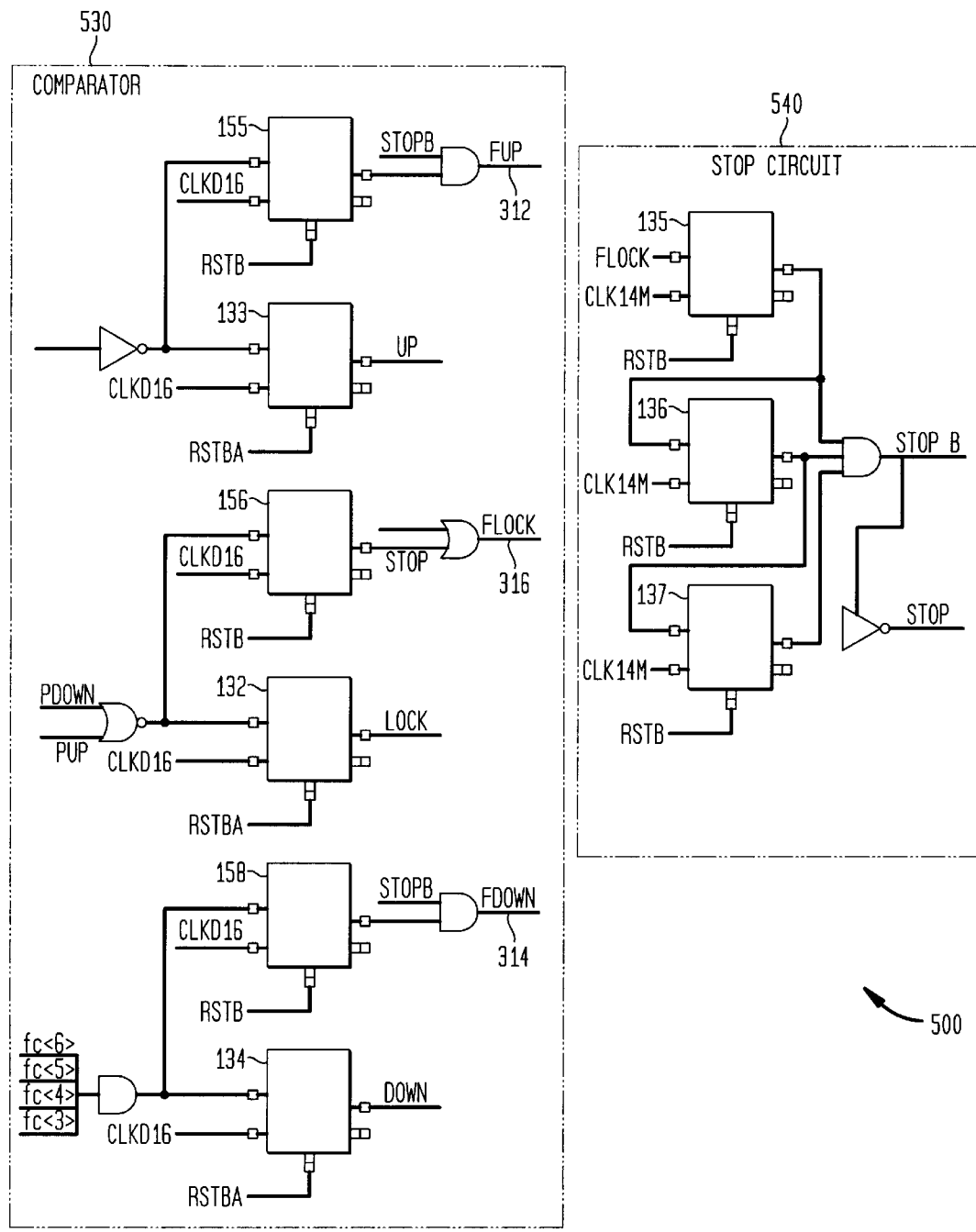

FIG. 5 shows an FDC in accordance with an embodiment of the present invention. As shown, an FDC 500 may include a frequency divider circuit 510, a frequency counter circuit 520, a comparator circuit 530, and an automatic stop circuit 540. Naturally, a person skilled in the art knows that many other configurations for the FDC 500 may provide the same frequency detector and stop function as the illustrative embodiment.

In operation, a reference clock CLK14M is divided by the frequency divider circuit 510 to produce a CLKD16 signal. The frequency counter circuit 520 counts up for every CLKIN signal produced by the divider 380 shown in FIG. 3. For every clocking transition (e.g., low to high transition) of the CLKD16, predetermined outputs of the frequency counter circuit 520 are latched and compared to the predetermined frequency range.

In the embodiment shown, the most significant bit (e.g., fc<6>) of the frequency counter 520 is examined to determine when the $F_{UP}$ signal 312 is produced, thereby determining the lower bounds of the predetermined frequncy range. The four most significant bits (e.g., fc<6>, fc<5>, fc<4>, and fc<3>) of the frequency counter 520 are examined to determine when the $F_{DOWN}$ signal 314 is produced, thereby determining the upper bounds of the predetermined frequncy range.

In operation, the comparator circuit 530 produces the $F_{UP}$ signal 312 when the frequency of the clock output 340 should be tuned up. The comparator circuit 530 produces the $F_{DOWN}$ signal 314 when the frequency of the clock output 340 should be tuned down. The comparator circuit 530 produces the $F_{LOCK}$ signal 316 when the frequency of the clock output 340 reaches the predetermined frequency range. Consequently, the comparator circuit 530 determines the predetermined frequency range.

In the embodiment shown, the reset period from the comparator, as determined by the frequency divider circuit 510, is equal to sixteen CLK14M. For a CLK14M=14.318 MHz, the reset period=1.117 $\mu$s. When the CLKIN signal is greater than 120÷1.117 $\mu$s (e.g., 107 MHz), the FDOWN signal 314 is produced. When the CLKIN signal is less than 64'1.117 $\mu$s (e.g., 57.29 MHz), the $F_{UP}$ signal 312 is produced. For the embodiment shown, the predetermined frequency range is therefore from 57.29 MHz to 107 MHz. However, as is apparent to a person of ordinary skill in the art, the predetermined frequency range may be readily narrowed or altered.

Illustratively, when the FLOCK signal 316 is active (e.g., high) for three clock cycles of the reference clock 330 (the locking frequency period), signifying that the predetermined frequency range is maintained for the locking frequency period, the stop circuit 540 produces STOP and STOPB signals. The STOP and STOPB signals drive the $F_{UP}$ signal 312 and the $F_{DOWN}$ signal 314 low while also driving the $F_{LOCK}$ signal 316 high. The $F_{UP}$ signal 312, the $F_{DOWN}$ signal 314, and the $F_{LOCK}$ signal 316 remain in these states, effectively disabling the FDC 500 and enabling the PFD 320, until a RSTB signal is received. The RSTB signal may be used by a system, for instance, when a new reference clock is received.

Figure 6:
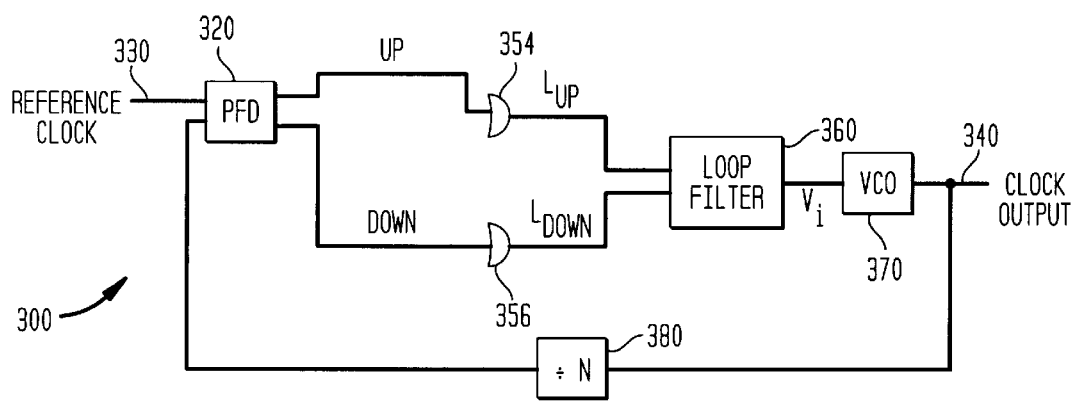
FIG. 6 is a functional circuit diagram of the present invention after the clock output has reached the predetermined frequency range.

After the locking frequency period, the FDC stops working and the PFD starts to work with the PLL system. FIG. 6 shows a functional circuit diagram of the present invention following the period after reaching the predetermined frequency range. In this period, the outputs of the PFD 320 control the PLL system 300. In operation, the input of the loop filter, Lup and Ldown, is effectively connected to the UP signal 322 and the DOWN signal 324, respectively.

Figure 7:
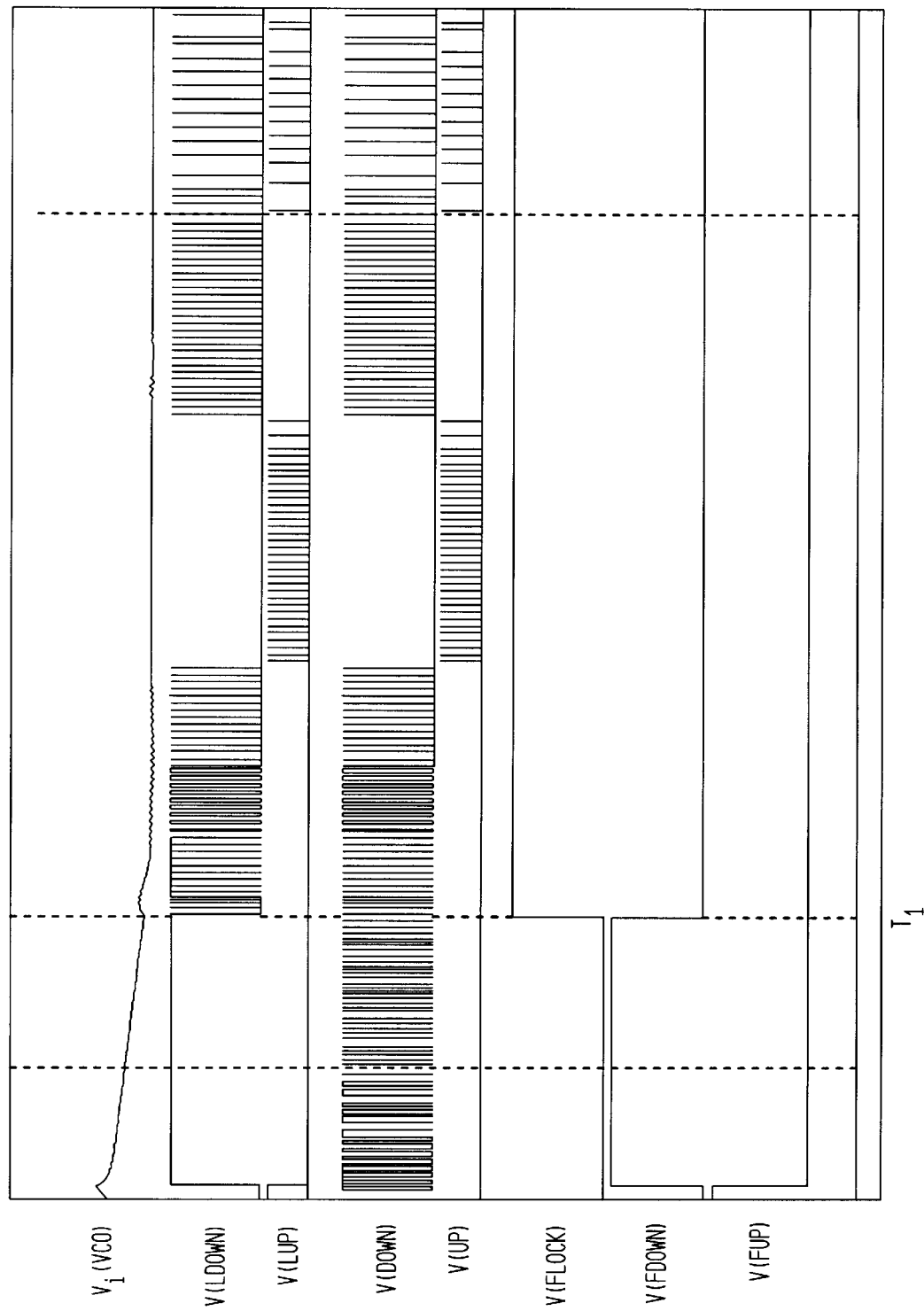
FIG. 7 is a timing diagram showing the response of a PLL system in accordance with the embodiment of the present shown in FIGS. 1 and 5.

FIG. 7 shows a timing simulation of the embodiment shown in FIGS. 3–6. As previously described, the PLL system 300 behaves as a frequency follower before the frequency is locked at a time T1. Prior to the time T1, the outputs of the FDC 310 control the behavior of the DC offset voltage $V_i$. After the time T1 following the frequency locking period, the outputs of the FDC 310 are disabled by the FLOCK signal 316, and the outputs of the PFD 320 control the behavior of the DC offset voltage $V_i$. In other words, after the time T1, the system behaves as a traditional PLL.

Conclusion

The PLL system disclosed in the present invention is stable, as the traditional PLL, yet produces a steady state output in less time. In addition, since the FDC is effectively disabled after the frequency locking time (e.g., after the predetermined frequency range is reached and maintained), the present inventive PLL system does not have problems with the FDC and PFD interacting during times of reference clock drift. Therefore, the present PLL system is stable during times of reference clock drift.

Finally, the above-discussion is intended to be merely illustrative of the invention. Numerous alternative embodiments may be devised by those having ordinary skill in the art without departing from the spirit and scope of the following claims.

The claimed invention is:

1. A phase lock loop (PLL) comprising:
    a frequency detector counter (FDC) configured to receive an input signal and a clock output signal, and configured to produce an FDC correcting signal until said clock output signal reaches a predetermined frequency range;
    an inhibiting circuit configured to disable said FDC from operating when said clock output signal reaches said predetermined frequency range, irrespective of any subsequent drift in the frequency of said clock output signal;
    a phase frequency detector (PFD) configured to receive said input signal and said clock output signal, and configured to produce a PFD correcting signal if said clock output signal does not equal said input signal;
    a loop filter configured to receive said FDC correcting signal and said PFD correcting signal, and configured to produce an output voltage in response to said received signals; and
    a voltage controlled oscillator configured to receive said output voltage and produce said clock output signal.

2. The PLL of claim 1, further comprising a logic circuit configured to receive said FDC correcting signal and said PFD correcting signal, configured to provide said FDC correcting signal to said loop filter until said clock output signal reaches said predetermined frequency range, and configured to provide said PFD correcting signal to said loop filter after said clock output signal reaches said predetermined frequency range.

3. A phase lock loop (PLL) comprising:
    a frequency detector counter (FDC) configured to receive an input signal and a clock output signal, and configured to produce an FDC correcting signal until said clock output signal reaches a predetermined frequency range;
    a phase frequency detector (PFD) configured to receive said input signal and said clock output signal, and configured to produce a PFD correcting signal if said clock output signal does not equal said input signal;
    a loop filter configured to receive said FDC correcting signal and said PFD correcting signal, and configured to produce an output voltage in response to said received signals;

a voltage controlled oscillator configured to receive said output voltage and produce said clock output signal;

said FDC comprising:

a frequency divider configured to receive said input signal;

a frequency counter configured to receive sid clock output signal; and a comparator configured to receive a frequency divider output and a frequency counter output, and configured to produce said FDC correcting signal.

4. The PLL of claim 1, wherein said FDC correcting signal comprises an up signal, a down signal, and a lock signal, and wherein:

(a) said FDC is configured to produce said up signal if said clock output signal is less than said predetermined frequency range, and said loop filter is configured to increase said output voltage in response to said up signal;

(b) said FDC is configured to produce said down signal if said clock output signal is greater than said predetermined frequency range, and said loop filter is configured to decrease said output voltage in response to said down signal; and (c) said FDC is configured to produce said lock signal if said clock output signal is within said predetermined frequency range, and said loop filter is configured to receive said PFD correcting signal in response to said lock signal.

5. The PLL of claim 3, wherein said FDC correcting signal comprises an up signal, a down signal, and a lock signal, and wherein:

(a) said comparator is configured to produce said up signal if said frequency counter output is smaller than a preset value in a predetermined interval of said frequency divider output, and said loop filter is configured to increase said output voltage in response to said up signal;

(b) said comparator is configured to produce said down signal if said frequency counter output is larger than said preset value in said predetermined interval of said frequency divider output, and said loop filter is configured to decrease said output voltage in response to said down signal;

(c) and said comparator is configured to produce said lock signal if said up signal and said down signal are not produced, and said loop filter is configured to receive said PFD correcting signal in response to said lock signal.

6. The PLL of claim 5, wherein said predetermined interval of said frequency divider output is a first predetermined interval, further comprising a stop circuit configured to receive said lock signal and said frequency divider output signal, and configured to produce a stop signal that disables said comparator if said lock signal is present for a second predetermined interval of said frequency divider output.

7. The PLL of claim 1, wherein the PLL is configured to synchronize to the frequency of said input signal prior to said clock output signal reaching said predetermined frequency range.

8. The PLL of claim 1, wherein the PLL is configured to synchronize to the frequency and phase of said input signal after said clock output signal reaches said predetermined frequency range.

9. The PLL of claim 4, wherein said loop filter comprises:

a. a charging switch connected to receive said up signal and configured to increase said output voltage in response to said up signal; and b. a discharging switch connected to receive said down signal and configured to decrease said output voltage in response to said down signal.

10. A method of synchronizing a clock output signal to an input signal comprising the steps of:

producing a frequency correcting signal until said clock output signal reaches a predetermined frequency range and not producing said frequency correcting signal when said clock output signal reaches said predetermined frequency range, irrespective of any subsequent drift in the frequency of said clock output signal, wherein said signal is produced utilizing said input signal and said clock output;

producing a phase-frequency correcting signal if said clock output signal does not equal said input signal;

producing an output voltage in response to said frequency correcting signal and said phase/frequency correcting signal; and producing said clock output signal in response to said output voltage.

11. A method of synchronizing a clock output signal to an input signal comprising the steps of:

producing a frequency correcting signal until said clock output signal reaches a predetermined frequency range and not producing said frequency correcting signal thereafter, wherein said signal is produced utilizing said input signal and said clock output;

producing a phase-frequency correcting signal if said clock signal does not equal said input signal;

producing an output voltage in response to said frequency correcting signal and said phase/frequency correcting signal;

producing said clock output signal in response to said output voltage;

said step of producing said frequency correcting signal comprising the steps of:

dividing said input signal;

counting the frequency of said clock output signal; and comparing the divided input signal and the frequency of said clock output signal to produce said frequency correcting signal.

12. The method of claim 10, wherein said step of producing said frequency correcting signal further comprises the steps of:

producing an up frequency correcting signal if said clock output signal is less than said predetermined frequency range and increasing said output voltage in response to said up frequency correcting signal; and producing a down frequency correcting signal if said clock output signal is greater than said predetermined frequency range and decreasing said output voltage in response to said down frequency correcting signal.

\* \* \* \* \*